United States Patent
Dos Reis

(10) Patent No.: US 11,996,813 B2
(45) Date of Patent: May 28, 2024

(54) ELECTRONIC CIRCUIT FOR AMPLIFIERS AND SOUND DEVICES FOR THE TRANSFER OF ELECTRIC POWER BETWEEN CHANNELS

(71) Applicant: Debones Dos Reis, Paulínia (BR)

(72) Inventor: Debones Dos Reis, Paulínia (BR)

( * ) Notice: Subject to any disclaimer, the term of this patent is extended or adjusted under 35 U.S.C. 154(b) by 0 days.

(21) Appl. No.: 17/476,468

(22) Filed: Sep. 15, 2021

(65) Prior Publication Data

US 2022/0385256 A1 Dec. 1, 2022

(30) Foreign Application Priority Data

May 31, 2021 (BR) .................. 10 2021 010534 8

(51) Int. Cl.
- *H03F 3/21* (2006.01)
- *H03G 5/16* (2006.01)
- *H04R 3/04* (2006.01)
- *H04R 3/12* (2006.01)

(52) U.S. Cl.
CPC ............... *H03G 5/165* (2013.01); *H03F 3/21* (2013.01); *H04R 3/04* (2013.01); *H04R 3/12* (2013.01); *H03F 2200/03* (2013.01); *H03G 2201/103* (2013.01); *H04R 2430/01* (2013.01)

(58) Field of Classification Search
CPC .... H03G 5/165; H03G 2201/103; H03F 3/21; H03F 2200/03; H04R 3/04; H04R 3/12; H04R 2430/01
USPC .......................................................... 381/109
See application file for complete search history.

(56) References Cited

U.S. PATENT DOCUMENTS

| | | | | |
|---|---|---|---|---|
| 5,506,821 | A * | 4/1996 | Burton, Jr. ......... | G11B 27/3063 |
| 2003/0107478 | A1 * | 6/2003 | Hendricks ............. | H04K 3/825 |
| | | | | 340/311.2 |
| 2011/0123054 | A1 * | 5/2011 | Adamson .................. | G01S 5/22 |
| | | | | 381/300 |
| 2014/0163311 | A1 * | 6/2014 | Davis, Jr. ................ | H04R 3/12 |
| | | | | 600/28 |
| 2021/0235192 | A1 * | 7/2021 | Healy .................... | H04R 1/028 |

FOREIGN PATENT DOCUMENTS

BR 202016019909-9 U2 3/2018

* cited by examiner

*Primary Examiner* — Carolyn R Edwards
*Assistant Examiner* — Friedrich Fahnert
(74) *Attorney, Agent, or Firm* — MUNCY, GEISSLER, OLDS & LOWE, P.C.

(57) ABSTRACT

An electronic circuit includes a microcontroller and a DSP (Digital Signal Processor), where the differential of the electronic circuit now proposed, is to transfer the output power to one of the different channels in a free and individual way, from one side to the other, being able to equalize and amplify each channel (speaker), permitting the power division not necessarily equal to said channels.

1 Claim, 1 Drawing Sheet

| | |
|---|---|
| 2 | microprocessor |
| 3 | digital signal processor (DSP) |
| 4 | audio input |
| 5 | preamplifier |
| 6 | AF power amplifier |
| 7 | switched power supply |
| 8 | audio frequency amplifier |
| 10 | auxiliary audio output |
| 11 | digital panel/display |
| 12 | dedicated application |

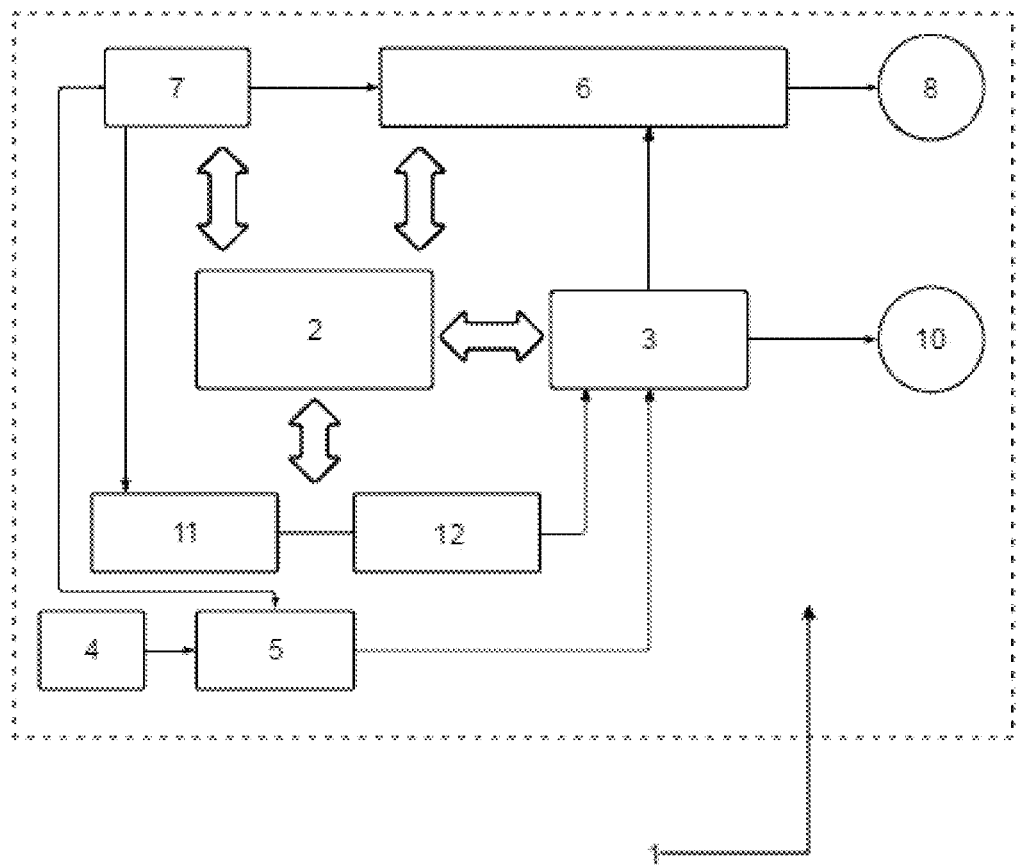
| 2 | microprocessor |
| --- | --- |
| 3 | digital signal processor (DSP) |
| 4 | audio input |
| 5 | preamplifier |
| 6 | AF power amplifier |
| 7 | switched power supply |
| 8 | audio frequency amplifier |
| 10 | auxiliary audio output |
| 11 | digital panel/display |
| 12 | dedicated application |

ELECTRONIC CIRCUIT FOR AMPLIFIERS AND SOUND DEVICES FOR THE TRANSFER OF ELECTRIC POWER BETWEEN CHANNELS

TECHNICAL FIELD

This descriptive report refers to the application for an invention patent for an electronic circuit for amplifiers and sound equipment with multiple channels, where the differential of the electronic circuit proposed herein is to transfer the output power to one of the different channels in a free and individual way, from one side to the other, being able to equalize and amplify each channel (speaker), permitting a power division, not necessarily equal to said channels.

For that purpose, the electronic circuit has a microprocessor interconnected to a DSP, to control the sending of maximum and minimum electrical power to each channel/speaker. Thus, the proposed control for power transfer from one side to the other, as well as the power division of the speaker channels, can be made through a digital control panel or from a mobile application, both of them with parameters related to the controls of each channel/speaker.

DISCUSSION OF THE BACKGROUND

It is known by technicians on the subject that an amplifier is a circuit responsible for controlling a larger electrical signal, from a smaller electrical signal (reference). The vast majority of multi-channel amplifiers a recharacterized for having the same power on all channels, so a 1000 W amplifier with 2 channels has 2 channels with 500 W each, or a 1000 W amplifier with 4 channels has 4 channels of 250 W each.

Sound systems, in order to have a better frequency response, usually consist of more than 1 way(speaker), that is, with different sizes and models of speakers (each speaker playing a certain frequency range) for a satisfactory answer. It is worth, remembering that larger and heavier speakers, dedicated to lower frequencies, are less efficient (in converting the electrical signal into acoustic energy), when compared to smaller speakers dedicated to higher frequencies. Therefore, it is necessary to apply higher power to the speakers dedicated to bass, and less power to midrange and treble speakers, in order to obtain a balanced sound system (the same level of sound intensity at all frequencies).

As an example of the matter above, representing the state of the art applied in the absence of a document closer to the matter to be described, document BR 202016019909-9, filed on Aug. 29, 2016, titled "ELECTRONIC CIRCUIT TO SUPPLY SOUND AMPLIFIERS WITHOUT A POWER SOURCE, DIRECTLY FROM THE ELECTRICAL NETWORK", which claims an electronic circuit with the function of eliminating the use of a high-power transformer, taking the energy directly from the electrical network. The circuit consists of a rectifier, two capacitors and a small transformer that allows the passage of as much energy as possible directly from the electrical network.

Anyway, despite the countless circuits in place for the amplification (power) of the sound in each channel of an amplifier or in each speaker of a sound system, it is known that multichannel amplifiers, in their immense majority, have the power equally divided across all their various channels. Thus, in several applications, this
 equal power for all channels can be a problem, as more
  power is needed for the speakers responsible for the lower frequencies and less power for the speakers responsible for the higher frequencies.

Thus, it is observed that it would be ideal to transfer the power that is excessive in the channel responsible for higher frequencies to the channel responsible for lower frequencies.

SUMMARY

Aware of the need to control the sending of electrical power to each channel and the need to transfer more or less power from one channel to another in a sound system, the inventor created an electronic circuit for these devices in order to offer the user the possibility of controlling the transfer of the amount of electrical power sent to each channel individually, according to the maximum power of the equipment. Thus, the circuit allows the user to control the power sent to each channel individually through a simple command on a digital panel of the equipment or via a dedicated application, being able to transfer the excess power in one channel to another channel of their choice, given that in the conventional method, if one channel comprises 1600 watts and the other 400 watts, the user cannot transfer power from one side to the other.

The circuit, therefore, offers the user greater flexibility, as it allows controlling the power sent to the amplifier channels in a simple and fast way, being able to operate with the same power in all channels or transfer unused power from one channel to another.

BRIEF DESCRIPTION OF THE DRAWING

To aid the understanding, the following FIGURE is attached:

The sole FIGURE is a view of the electrical block diagram according to the invention.

DETAILED DESCRIPTION

As shown in the FIGURE, the "ELECTRONIC CIRCUIT FOR AMPLIFIERS AND SOUND DEVICES FOR THE TRANSFER OF ELECTRIC POWER BETWEEN CHANNELS" under this patent application consists of an electronic circuit (1) dedicated to transferring the output power to one of the channels/speakers in a free and individual way, from one side to the other, being able to equalize and amplify each channel (speaker), permitting a power division not necessarily equal for to said channels. The electronic circuit (1) comprises a microprocessor (2) connected to a DSP (3) (Digital Signal Processor) to control the sending of maximum and minimum electrical power to each channel/speaker.

More specifically, the electronic circuit (1) acts in the audio input (4) interconnected to a preamplifier (5), which communicates with the DSP (3), whose function is to process and optimize the signal and perform the equalization and amplification of each channel (speaker), while the DSP (3) is interconnected to an AF power amplifier (6), which is connected to a switched power supply (7) an SMPS DC-DC, which regulates and adjusts the desired voltage in the electronic circuit (1). It is worth pointing out that the switched power supply (7) or SMPS DC-DC communicates all the time with the preamp (5) and therefore with the DSP (3).

In time, the AF power amplifier (6) is interconnected to an audio frequency amplifier (8) AF, whose function is to increase the amplitude of the audio frequency signal. In this way, the microprocessor (2) connected to the DSP (3)

processes and stores the information of the electronic circuit (1), while the DSP (3) is connected to an auxiliary audio output (10). Nevertheless, the electronic circuit (1) can be controlled by a digital panel/display (11) and/or dedicated application (12), so that the user can control the power sent to each channel individually, being able to transfer the excess power on one channel to another channel of their choice.

Therefore, the digital panel/display (11) can be installed on the amplifier/sound system itself, as well as the dedicated application (12), can provide individual control parameters to allow the user to control the sending of electrical power to one channel/speaker of the amplifier/sound system by the DSP (3).

That is, the electronic circuit (1) works as a kind of electrical power equalizer, distributing it between the channels/speakers of the sound system freely and as defined by the user, allowing from the normal balance of the power of each channel, up to the use of the power initially intended to a certain channel to feed another channel, which, therefore, has its power increased (power transfer). The electronic circuit (1) allows for increasing and decreasing the power of each channel individually, as well as taking power from one or more channels to use in another.

In this way, an amplifier with four channels, for example, could have one of its channels fed with part of the electrical power that would be sent to the other three channels, as well as it could have its electrical power reduced or cut off, without changing the other channels, as well as performing the division and power, not necessarily equal to said channels.

Therefore, unlike circuits already available on the market, the electronic circuit (1) has full control over the independent maximum power in each of the outputs, and can also be adjusted by the user in addition to the ability of transferring power from a channel to the other.

The invention claimed is:

1. An electronic circuit for amplifiers and sound devices configured to promote control of electrical power between channels of a multi-channel amplifier, the electronic circuit is dedicated to a plurality of audio amplifiers or a multi-channel sound system, said plurality of audio amplifiers or multi-channel sound system comprising:
    an audio input interconnected to a pre-amplifier;
    an audio frequency (AF) power amplifier;
    a switched power supply;
    an audio frequency amplifier; and
    an auxiliary audio output,
    wherein the electronic circuit comprises:
        a digital signal processor (DSP) configured to process and optimize a signal and perform equalization and amplification of each channel, the electronic circuit being configured to:
            transfer output power to each of the channels freely and individually;
            equalize and amplify each channel; and
            permit division of power not necessarily equal to said channels; and
        a digital panel/display and a dedicated application including individual control parameters configured to allow a user to control the DSP to transfer an amount of the output power sent to each of the channels individually and to allow the user to transfer excess power from one of the channels to another of the channels of the user's choice,
    wherein the DSP is interconnected to the pre-amplifier connected to an audio input;
    wherein the DSP has a connection with the AF power amplifier, connected to the switched power supply, the switch power supply, and the audio frequency amplifier,
    wherein the DSP is interconnected to a microcontroller that processes and stores electronic circuit information, and
    wherein the DSP is interconnected to the auxiliary audio output.

* * * * *